United States Patent
Köse et al.

(10) Patent No.: US 10,277,184 B1
(45) Date of Patent: Apr. 30, 2019

(54) ANALOG AUTOMATIC GAIN CONTROL BASED ON ESTIMATED DISTRIBUTIONS OF SIGNAL CHARACTERISTICS

(71) Applicant: TrellisWare Technologies, Inc., San Diego, CA (US)

(72) Inventors: Cenk Köse, San Diego, CA (US); Keith M. Chugg, La Cañada, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 0 days.

(21) Appl. No.: 15/984,044

(22) Filed: May 18, 2018

(51) Int. Cl.
- *H04B 17/30* (2015.01)
- *H03G 3/30* (2006.01)
- *H04B 1/12* (2006.01)
- *H03F 3/19* (2006.01)

(52) U.S. Cl.
CPC ............ *H03G 3/3036* (2013.01); *H03F 3/19* (2013.01); *H04B 1/123* (2013.01); *H03F 2200/451* (2013.01); *H03G 2201/103* (2013.01); *H03G 2201/206* (2013.01); *H03G 2201/307* (2013.01)

(58) Field of Classification Search
CPC .......... H04B 1/06; H04B 17/20; H04B 17/30; H04B 17/309; H04B 17/391
See application file for complete search history.

(56) References Cited

U.S. PATENT DOCUMENTS

| | | | |
|---|---|---|---|
| 7,277,510 B1 | 10/2007 | Kilani et al. | |
| 9,742,371 B2 | 8/2017 | Ferrante et al. | |
| 2009/0004990 A1* | 1/2009 | Renard | H01G 3/3052 455/296 |
| 2010/0080327 A1* | 4/2010 | Zhang | H03G 3/3052 375/345 |
| 2015/0303960 A1* | 10/2015 | Ferrante | H03G 3/3078 455/234.1 |

FOREIGN PATENT DOCUMENTS

CN 107567089 A * 1/2018 ........... H04B 17/327

* cited by examiner

*Primary Examiner* — Blane J Jackson
(74) *Attorney, Agent, or Firm* — Perkins Coie LLP

(57) ABSTRACT

Devices, systems and methods for analog automatic gain control (AGC) based on estimated distributions of signal characteristics are described. One example method includes generating a digital measurement of a first signal characteristic based on a second signal characteristic of an input signal received by the device, where the second signal characteristic is based on a level of the input signal. The digital measurement of the signal characteristic is used to update a statistical model for the input signal and the posterior probability distribution of the second signal characteristic conditioned on previous digital measurements of the first signal characteristic. The updated posterior probability distribution is used to generate a gain estimate, which is then used to adjust the power level of the input signal. Another example method may use multiple statistical models for each waveform supported by the system.

20 Claims, 11 Drawing Sheets

ANALOG AUTOMATIC GAIN CONTROL BASED ON ESTIMATED DISTRIBUTIONS OF SIGNAL CHARACTERISTICS

TECHNICAL FIELD

This document is directed to circuitry, devices or systems with analog automatic gain control (AGC) in various applications including wireless communications.

BACKGROUND

A receiver in various devices for receiving and processing an input signal may be subject to variations in received signal power and such variations may be significant sometimes and thus can adversely impact the receiver operations. Gain control circuits can be implemented in such a receiver to adjust the analog signal power level at the input of the analog-to-digital converter (ADC). Receivers with gain control circuits are used in various devices including radio receivers in wireless communications.

SUMMARY

This document relates to methods, systems, and devices for analog automatic gain control (AGC) based on estimated distributions of signal characteristics. Embodiments of the disclosed technology can be configured to provide near-optimal sequential AGC gain decisions even when the level of the input signal is out of the dynamic range of the ADC. This may be achieved by treating a first signal characteristic (e.g., the power level) of the analog signal as a random variable over a set of predetermined values. A model for a second signal characteristic given previous digital measurements of the signal characteristic is adopted, and a perceived probability distribution over the set is then updated given each new digital measurement of the first signal characteristic. The disclosed AGC technology can be implemented in various devices including wireless communication receivers in wireless communication systems, including, e.g., radio communication devices, mobile devices and base stations in broad wireless networks.

In one exemplary aspect, a method for analog automatic gain control based on estimated distributions of signal characteristics is disclosed. The method includes generating a digital measurement of a first signal characteristic based on a second signal characteristic of an input signal received by the device, where the second signal characteristic is based on a level of the input signal, updating a probability distribution based on the digital measurement of the first signal characteristic and a statistical model for the input signal, where the probability distribution is based on an estimate of a posterior probability distribution of the second signal characteristic conditioned on a plurality of previous digital measurements of the first signal characteristic, generating a gain estimate based on the probability distribution, and adjusting the level of the input signal based on the gain estimate.

In another exemplary aspect, a method for analog automatic gain control based on estimated distributions of signal characteristics is disclosed. The method includes generating a digital measurement of a first signal characteristic based on a second signal characteristic of an input signal received by the device, where the second signal characteristic is based on a level of the input signal, updating a plurality of probability distributions, where each of the plurality of probability distributions is updated based on the digital measurement of the first signal characteristic and a respective statistical model for the input signal of a plurality of statistical models, and where each of the plurality of probability distributions is an estimate of a posterior probability distribution of the second signal characteristic conditioned on a plurality of previous digital measurements of the first signal characteristic, generating an averaged probability distribution based on the plurality of probability distributions, generating a gain estimate based on the averaged probability distribution, and adjusting the level of the input signal based on the gain estimate.

In yet another exemplary aspect, the above-described methods are embodied in the form of processor-executable code and stored in a computer-readable program medium.

In yet another exemplary embodiment, a device that is configured or operable to perform the above-described methods is disclosed.

The above and other aspects and their implementations are described in greater detail in the drawings, the descriptions, and the claims.

DETAILED DESCRIPTION

The present document discloses framework based on estimated distributions of signal characteristics for analog automatic gain control (AGC) circuits commonly used in receivers of mobile digital communication systems. In some embodiments, and under the assumption of independent digital measurements of the signal characteristic, the disclosed technology may be used to formulate near-optimal sequential AGC gain decisions, providing an alternative to ad-hoc gain steps applied in practice especially when the level of the input signal is out of the dynamic range of the ADC. The utility of some embodiments of the disclosed technology are described in the context of an OFDM waveform, and with the power level as a signal characteristic. These are examples, and the disclosed AGC technology can be used in a range of receivers including receivers in wired and wireless communications, and with different signal characteristics.

As a specific example, mobile wireless communication receivers tend to be subject to significant variations in received signal power due to various factors affecting the receiver operation, e.g., variable link distance, dynamic multipath propagation, interference, or instantaneous power variations inherent in the transmit waveform. The combination of these factors limits the effective dynamic range of the radio front-ends; as a result, gain control circuits can be used to adjust the analog signal power level at the input of the analog-to-digital converter (ADC) to improve the receiver operation while mitigating undesired results from such gain control, e.g., reducing nonlinear distortion.

Figure 1A:
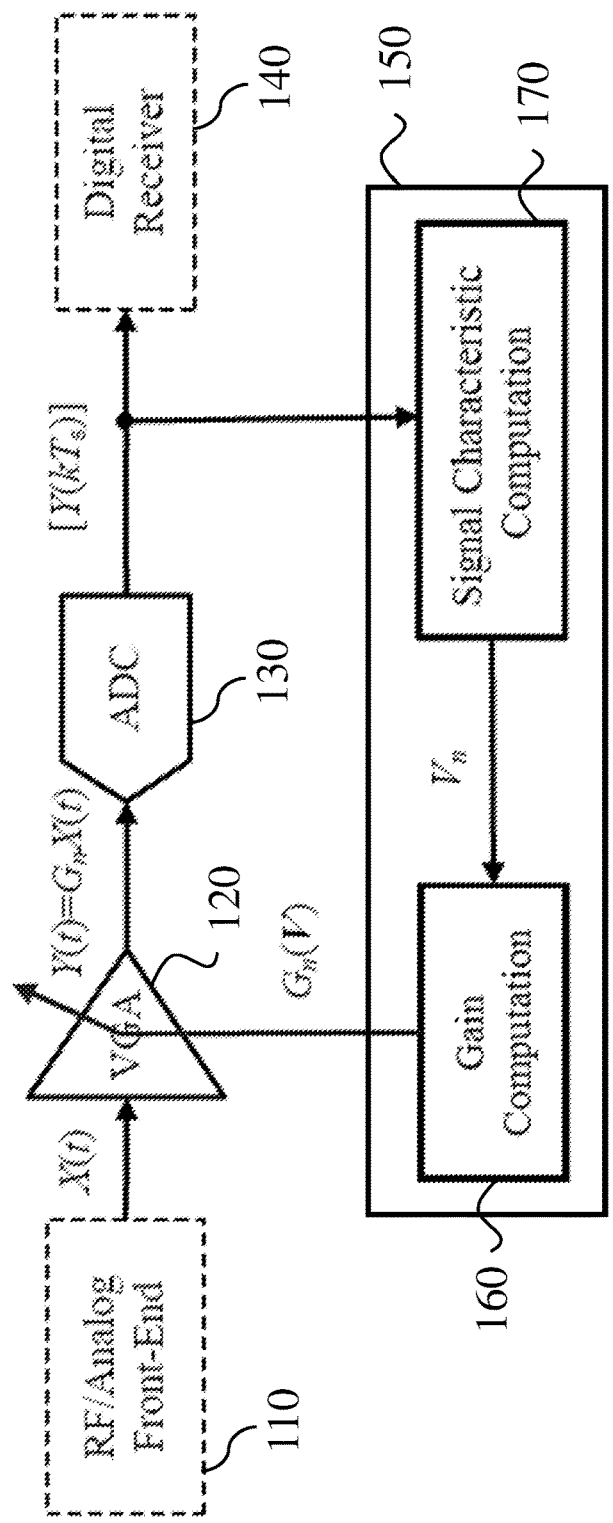
FIGS. 1A and 1B show block diagrams of example systems for analog automatic gain control (AGC) based on estimated distributions of signal characteristics.

FIG. 1A shows a block diagram of an example automatic gain control (AGC) loop. A variable gain amplifier (VGA) 120 is used to adjust the level of the input analog signal X(t) such that the signal Y(t) at the input of the ADC 130 is at a desired level at the end of an AGC period. It is assumed that X(t) is a real-valued, zero-mean process with an unknown signal characteristic (or level) U that is indicative of (or generally tracks) the power of X(t), and which is given as $$U \langle \triangleq \langle f(X(t)) \rangle.$$

where $f(\bullet)$ is a non-negative function that operates on the input signal to produce the signal level value. Examples of this function include, but are not limited to, the power, root mean square value, or the L1-norm of X(t), and where $\triangleq \bullet \rangle$ is a time average.

In some embodiments, the non-negative function $f(\bullet)$ may be computed as:

$$f(\{X(t)\}) = \frac{1}{T}\int_{t\in T_I} X^2(t)dt \text{ (power)}$$

$$f(\{X(t)\}) = \sqrt{\frac{1}{T}\int_{t\in T_I} X^2(t)dt} \text{ (RMS)}$$

$$f(\{X(t)\}) = \frac{1}{T}\int_{t\in T_I} |X(t)|dt \text{ (L1-norm)}$$

where $T_I$ is the time interval (of length T) over which the measurement computation (e.g., power, RMS, L1, and the like) is valid, e.g., a packet or a burst.

The gain computation circuit 160 is driven by digital measurements of a signal characteristic obtained at the output of the ADC, e.g., using simple sample-power measurements, or power measurements from the output of a correlator using a reference AGC signal, or the L1-norm or root mean square (RMS) value of the output of the ADC. Without loss of generality, the output V of the signal characteristic computation circuit 170 is therefore an estimate of a signal characteristic that is representative of the prevalent signal power at the output of the ADC. In some embodiments, the signal characteristic may be the power. In other embodiments, the signal characteristic may be the L1-norm or the RMS of the samples or of the output of the correlator. In some embodiments, any non-negative function that produces a value that is characteristic of the signal level may be used. As shown in FIG. 1A, the digital measurements of the signal characteristic are used to drive the gain computation circuit 160.

In some embodiments, the AGC loop may be preceded by a radio-frequency (RF) or analog front-end 110, which may be configured to process the received signal. In an example, the front-end may perform frequency conversion and filtering operations. In other embodiments, the AGC loop may be followed by a digital receiver 140, which may be configured to process the digital samples of the received signal. In an example, the digital receiver may be configured to perform at least one of demodulation, equalization and decoding.

In some embodiments, the gain computation circuit 160 and the signal characteristic computation circuit 170 may be implemented on a single processor 150. In other embodiments, distinct processors may implement the functionality of the signal characteristic computation and gain computation circuits. In yet other embodiments, one or more of these processor(s) may comprise the functionality of the ADC and/or the VGA.

The ADC Quantization function may be represented as $$y \mapsto [y] \triangleq \begin{cases} A_{max}, & y \geq A_{max}, \\ \Delta \cdot \text{round}\left(\frac{y}{\Delta}\right), & -A_{max} < y < A_{max}, \\ -A_{max}, & y \leq -A_{max}, \end{cases}$$

where $A_{max}$ is the full-scale amplitude of the ADC, and $\Delta$ is its quantization step size. The power of the input signal with respect to the ADC dynamic range may be specified with the convention that a sinusoidal signal with amplitude $A_{max}$ has 0 (zero) dB (with respect to) full-scale (dBFS) power. When U represents the power of the analog signal, i.e. $U=\triangleq |X((t)|^2\rangle$, this may be represented as $$U_{dBFS} \triangleq 10\log_{10}\left(\frac{U}{0.5A_{max}^2}\right).$$

The AGC design is expected to provide the desired level adjustment prior to digital payload processing, at which point the gain settings are frozen for the remainder of the transmission. For burst communication systems, the received signal level needs to be adjusted on a packet-by-packet basis, which requires a portion of each packet to be dedicated for this task. Due to the large variability in expected level of the received signal, this overhead could be non-negligible, resulting in commensurate throughput losses. Moreover, an inaccurate signal level acquisition may lead to performance losses, either due to quantization noise or nonlinear distortion. A low-overhead AGC with reliable power adjustment may advantageously address these issues.

Figure 2:
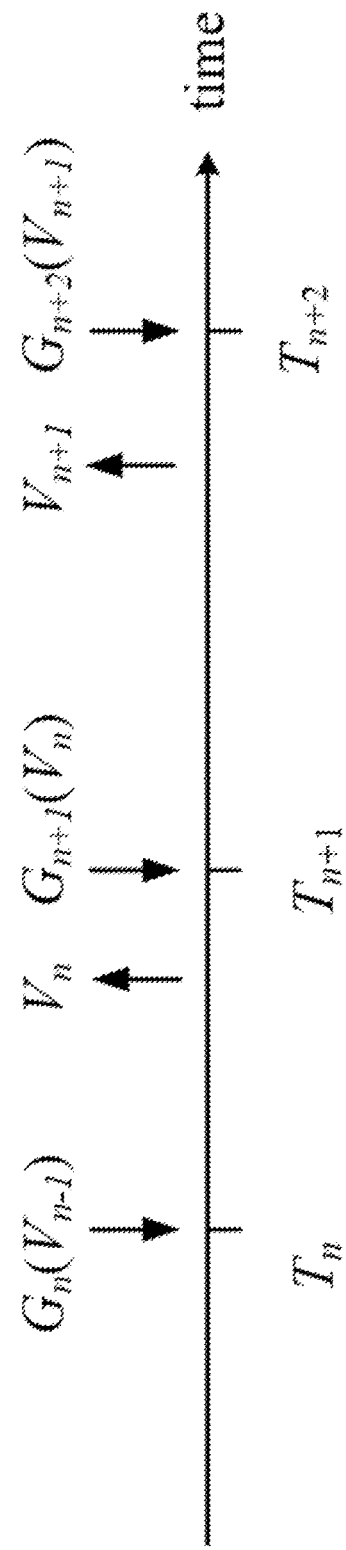
FIG. 2 shows an example timeline of the sequential decision framework for an analog AGC based on estimated distributions of signal characteristics.

The gain control problem is modeled using a sequential decision setting in which non-overlapping time intervals or epochs $[T_n, T_{n+1})$, n=0,1, . . . are defined. FIG. 2 shows an example timeline of the sequential decision setting. As shown therein, at time $T_n$, a gain $G_n$ is applied to the analog input signal, which results in a digital power measurement of $V_n=V_n(G_n)$ available at some time after $T_n$. Based on this measurement $V_n$, a gain decision $G_{n+1}=G_{n+1}(V_n)$ is computed, and applied at time $T_{n+1}>T_n$.

In some embodiments, each gain decision may be determined as a function of the past digital measurements of the signal characteristic from the ADC output (and therefore past gain decisions), and represented as $$\left.\begin{array}{l}\text{(observation)}V_n = V_n(G_n) \\ \text{(gain decision)}G_{n+1} = G_{n+1}(V_0^n)\end{array}\right\} n = 0, 1, \ldots$$

starting from an initial gain $G_0$ and a first observation $V_0(G_0)$.

In some embodiments, AGC operations rely on gain adjustments of the form $$G_{n+1} = G_n + \sigma_n \times (V^* - \tilde{V}(V_0^n)),$$

where $\tilde{V}$ is a filtered version of the prevalent digital measurements $\{V_n\}$, and $\sigma_n$ is step size. The step size(s) is determined in an ad-hoc manner, since, for example it may be impractical to know a priori how strong the analog signal is based on saturated ADC output measurements. Thus, it may be unrealistic to formulate a gain adjustment algorithm that would serve all operating conditions equally well. A more aggressive initial adjustment (large initial step size) is required for very strong incident analog signals, and the step size can only be reduced once the signal is deemed to be within ADC range.

In the present disclosure, a statistical model for the observed digital measurements of the signal characteristic $V_n$ as a function of another hypothesized signal characteristic U is introduced. With each available digital measurement of the second signal characteristic based on the ADC output, the probability that the unknown first signal characteristic U assuming a set of values is updated, and a subsequent gain decision is made. In this fashion, and in an example, regardless of the analog signal power, a near-optimal gain adjustment may be performed, as long as the analog signal power is within the hypothesized range, which may be arbitrarily large. For example, and as described, some embodiments of the disclosed technology may be based on this statistical framework (referred to as a Bayesian framework) of gain control.

This AGC framework treats the unknown level of the input signal U as (a realization of) a random variable over a set of predetermined values. The perceived probability distribution over this set is then adapted with each digital measurement of the second signal characteristic V, using a model $p(U|V)$ where V is a vector of the available past digital measurements.

Figure 1B:
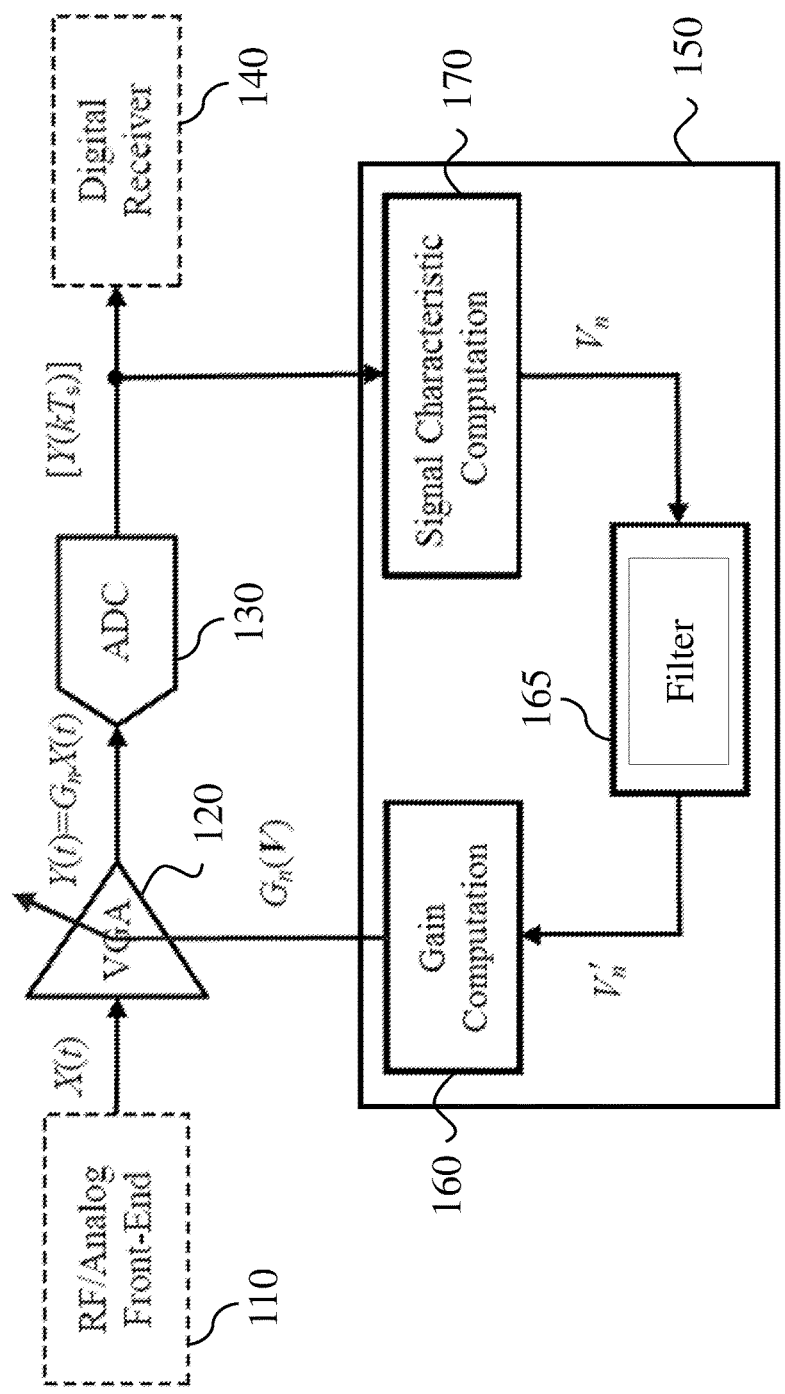

It is assumed that the duration between consecutive gain correction steps is large enough such that the digital measurements $\{V_n\}$ are (conditionally) independent given U. For this assumption to hold, this duration should be greater than the settling time of the VGA (during which the actual VGA gain is unreliable), and twice the maximum delay spread of the physical channel. In some embodiments, the digital measurements $\{V_n\}$ may be available frequently enough such that they no longer be assumed conditionally independent given analog level U. In this scenario, the sequence $\{V_n\}$ may first be filtered, producing a sequence $\{V_n'\}$ for which the conditional independence holds approximately. Embodiments of the disclosed technology may be use the sequence $\{V_n'\}$, instead of the sequence $\{V_n\}$, as shown in FIG. 1B.

In an example, $\{V_n\}$ may be available at regular time intervals $t=nT$, $n=0,1,2,\ldots$; and the sequence $\{V_n'\}$ may be computed as $$V_n' = V_n - \hat{V}_n$$

$$\hat{V}_n = \sum_{m=1}^{M} f_m V_{n-m}$$

where $\{f_m\}$ constitute the taps of a prediction error filter. In some embodiments, the filter taps may be chosen based on expected correlation between digital power measurements.

As shown in FIG. 1B, the digital measurements of the signal characteristic $\{V_n\}$, which are generated by the signal characteristic computation circuit 170, are filtered by the filter 165 to generate the filtered sequence $\{V_n'\}$ that is used to drive the gain computation circuit 160. In some embodiments, the filter 165 may be a prediction-error filter (PEF), which removes the predictable information from an input signal, leaving the unpredictable information, e.g., the prediction error (which is typically white, or independent). More generally, the filter 165 whitens the input signal to produce independent output samples.

In some embodiments, the gain computation circuit 160, the filter 165 and the signal characteristic computation circuit 170 may be implemented on a single processor 150. In other embodiments, distinct processors may implement the functionality of the signal characteristic computation, the filter and gain computation circuits.

With the independence assumption, the gain decisions at each epoch only depend on the previous digital observation of the signal characteristic, and the model can be rewritten as $$\left. \begin{array}{l} \text{(observation)} V_n = V_n(G_n) \\ \text{(gain decision)} G_{n+1} = G_{n+1}(V_n) \end{array} \right\} n = 0, 1, \ldots$$

It is further assumed that the probability distributions $$\{\rho(V|U) \triangleq p(V(G=1)|U) : V \in S_V\}_{U \in S_U}$$

that is the conditional probability distribution of the digital measurement V given the level (or characteristic) of the input signal U for a particular reference AGC gain level, e.g. G=1, are available for a set $S_U$ of a first signal characteristic (in the analog domain) of practical significance, and another set $S_V$ of digital measurements of the second signal characteristic. The range of $S_U$ may be determined using the radio specifications on sensitivity and maximum power that can be handled by the radio front-end. The distribution $p(V|U)$ can be computed a priori based on a statistical model for $X(t)$, e.g. Gaussian. Note that, due to the clipping nature of the ADC, $S_V \subset S_U$. It is further assumed that the VGA may be configured with a wide enough range of gains, and with arbitrary precision.

The analog power distribution $$\pi_n(U) \triangleq p(U|V_0^n), U \in S_U$$

is defined be the posterior probability distribution of U conditioned on all the digital measurements available at step n. Under the assumption of independent measurements, it is verified using Bayes Rule that $$\pi_{n+1}(U) = \frac{p(V_n(G_n) | U) \pi_n(U)}{\sum_{U' \in S_U} p(V_n(G_n) | U') \pi_n(U')}$$

$$= \frac{\rho(V_n | G_n^2 U) \pi_n(U)}{\sum_{U' \in S_U} \rho(V_n | G_n^2 U') \pi_n(U')}.$$

Prior to any measurements, the probability distribution is assumed to be uniform, which may be represented as $\pi_n(U)=1/|S_U|$, $n<0$.

In some embodiments, the first and second signal characteristics may be the same (e.g., power, RMS value, L1-norm, and the like). In other embodiments, the first and second signal characteristics may be different, e.g., power in the analog domain (as the first characteristic) and the RMS value in the digital domain (as the second characteristic).

Embodiments of the disclosed technology formulate the gain decisions {G} such that after the final gain adjustment, a target power level V* is achieved. The target power level may selected to ensure that the probability of ADC clipping is very small. Thus, after N epochs the following approximation may be achieved:

$$G_N^2 U \approx V^*.$$

In some embodiments, the following decisions rules are considered:

$$(\text{mean-based})G_{n+1}^2 = \frac{V^*}{\mathbb{E}_{\pi_n} U} = \frac{V^*}{\sum_{U \in S_U} \pi_n(U) U}$$

$$(\text{max-based})G_{n+1}^2 = \frac{V^*}{\text{argmax}_{U \in S_U} \pi_n(U)}$$

which prescribe a gain adjustment based on the mean and the maximum of the posterior distribution of the analog signal power, respectively.

In some embodiments, a single distribution may not be sufficient to describe the sample statistics of the received waveform, due to different propagation conditions and multiple different waveform types implemented in a single radio. For example, the sample statistics of constant-envelope waveforms received in line-of-sight conditions at high SNR is quite different than those of OFDM waveforms; therefore a Gaussian assumption for the former will create a model mismatch if the latter is used. For these cases, embodiments of the disclosed technology may consider different conditional probability distributions $$\{p^{(i)}(\bullet|\bullet)\}$$

of power measurements, one for each assumed sample statistic for the received waveform, and associated probabilities $\{\mu_n^{(i)}\}$ for each step n. The posterior distribution of U may then be updated under each waveform statistics hypothesis as:

$$\pi_{n+1}^{(i)}(U) = \frac{p^{(i)}(V_n(G_n)|U)\pi_n^{(i)}(U)}{\sum_{U' \in S_U} p^{(i)}(V_n(G_n)|U')\pi_n^{(i)}(U')}$$

$$= \frac{\rho^{(i)}(V_n|G_n^2 U)\pi_n^{(i)}(U)}{\sum_{U' \in S_U} \rho^{(i)}(V_n|G_n^2 U')\pi_n^{(i)}(U')}.$$

Similarly, the probability of each such hypothesis may be updated as:

$$\mu_{n+1}^{(i)} = \frac{\sum_{U \in S_U} \rho^{(i)}(V_n|G_n^2 U)\pi_n^{(i)}(U)\mu_n^{(i)}}{\sum_{j} \sum_{U \in S_U} \rho^{(j)}(V_n|G_n^2 U)\pi_n^{(j)}(U)\mu_n^{(j)}}.$$

In some embodiments, the waveform-averaged posterior distribution for U may be defined as:

$$\bar{\pi}_n(U) = \sum_i \pi_n^{(i)}(U)\mu_n^{(i)}.$$

The mean-based and max-based gain decision rules, in the case of multiple hypotheses, may be defined as:

$$(\text{mean-based})G_{n+1}^2 = \frac{V^*}{\mathbb{E}_{\bar{\pi}_n} U} = \frac{V^*}{\sum_{U \in S_U} \bar{\pi}_n(U) U}$$

$$(\text{max-based})G_{n+1}^2 = \frac{V^*}{\text{argmax}_{U \in S_U} \bar{\pi}_n(U)}$$

Figure 3:
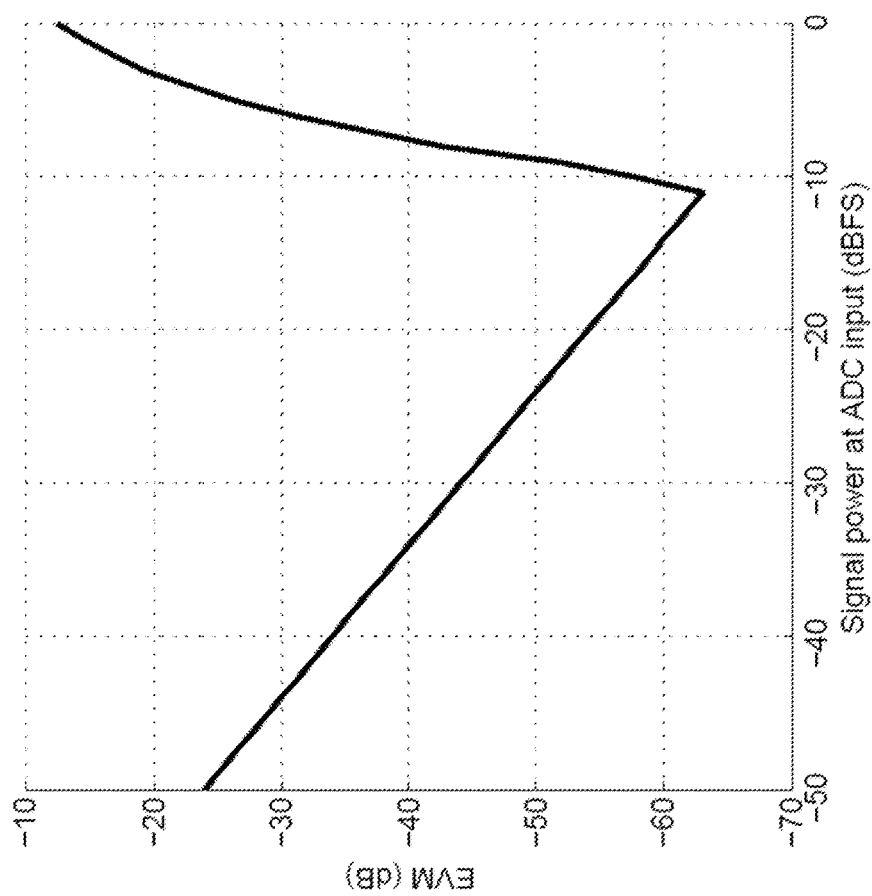
FIG. 3 shows a plot of the error-vector magnitude vs. the received power at the input of the analog-to-digital converter for an exemplary embodiment of the disclosed technology.
Figures 4A, 4B:
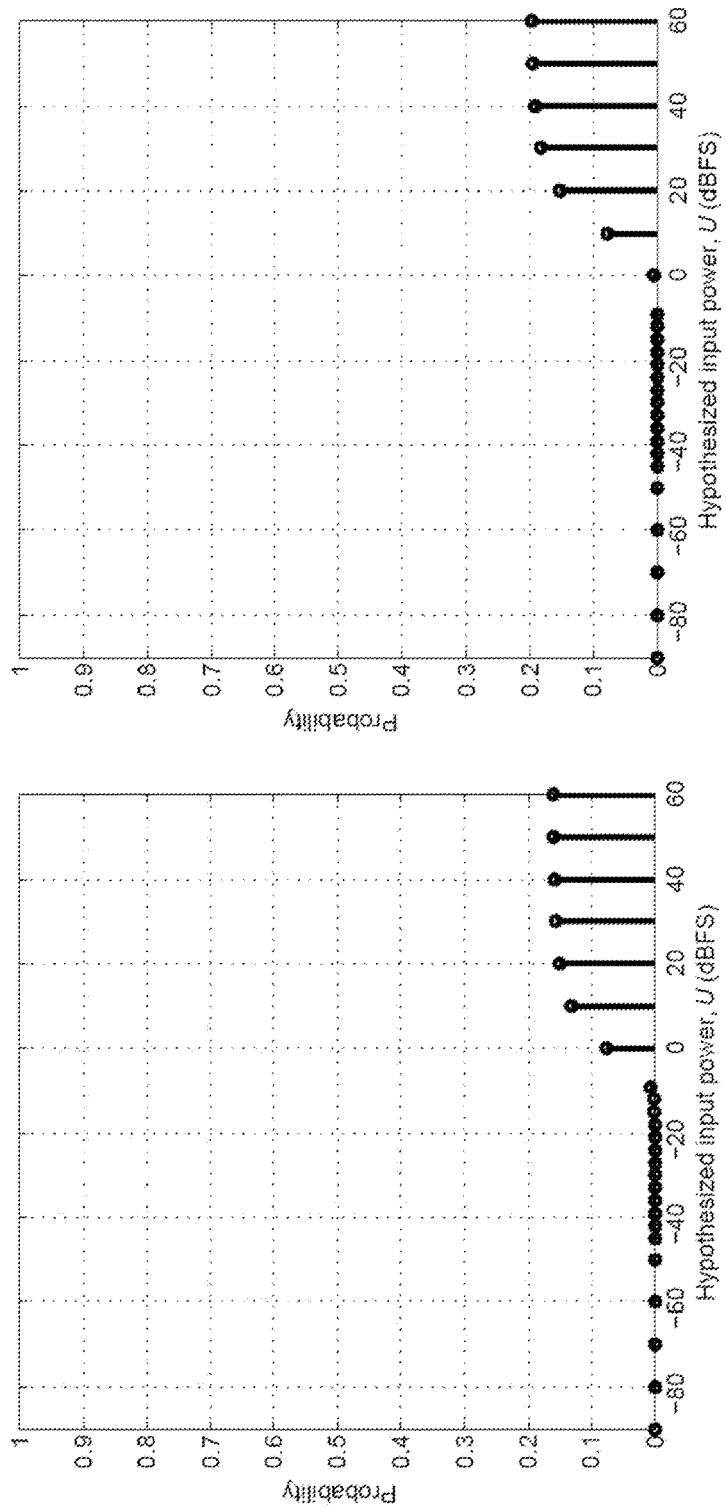
FIGS. 4A-4D show the evolution of the posterior probability as a function of the number of observations for an exemplary embodiment of the disclosed technology.
Figure 4C:
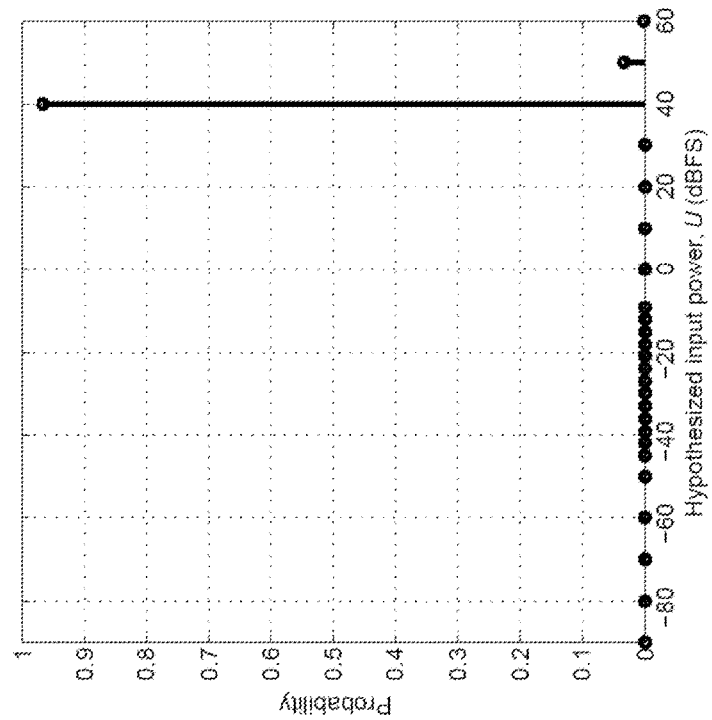
Figure 4D:
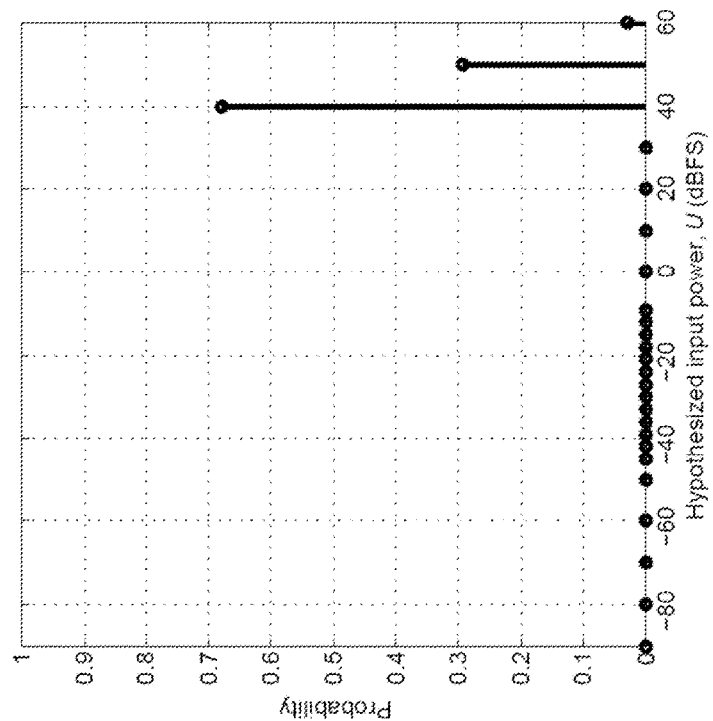

In an example, an OFDM waveform with bandwidth 20 MHz, employing 1024 subcarriers modulated using 16-QAM (Quadrature Amplitude Modulation) signal set and BPSK (Binary Phase Shift Keying) pilot symbols is considered. In the absence of any channel distortion and noise, FIG. 3 displays the error-vector magnitude (EVM) of the transmit signal as a function of the input signal level, measured at the output of the receiver FFT.

The EVM is dominated by the quantization noise at the low end of the received signal power, and by the ADC clipping at the high end. The middle region, for which the EVM would not dominate practical operating SNR values (0-25 dB), represents an acceptable domain for V*.

The signal-of-interest is received after linear distortion by a multipath channel with delay spread 2 μsec, at SNR=15 dB. The observables are sample-power measurements at the ADC output, $V_n = [Y(nT)]^2$, taken every T=5 μsec, which is the AGC epoch. In this example, the AGC may be configured as follows:

(a) Analog ($S_U$) and digital power ($S_V$) hypothesis sets are set to $$(S_U)_{dBFS} = \{-90{:}10{:}{-}50, -45{:}3{:}{-}9, 0{:}10{:}160\}, (S_V)_{dBFS} = \{-78{:}6{:}0\},$$

These sets cover an analog range of 150 dB with 25 power hypotheses, and a digital range of 78 dB with 14 power hypotheses. This results in a storage requirement of 400 probability variables (14×25=350 for ρ(•|•), plus another 2×25=50 for π(•), assuming double buffering for updates). Note that a finer granularity (3 dB steps) for the power hypotheses around the useful range of the ADC is used, compared to the 10 dB steps outside this range. Without loss of generality, the initial AGC gain may be set to unity such that $G_0=1$.

(b) ρ(•|•) is computed using Gaussian sample statistics for X(t).

(c) The mean-based decision rule is implemented for gain decisions.

(d) The target digital signal power is set to V*=−30 dBFS.

Figure 5:
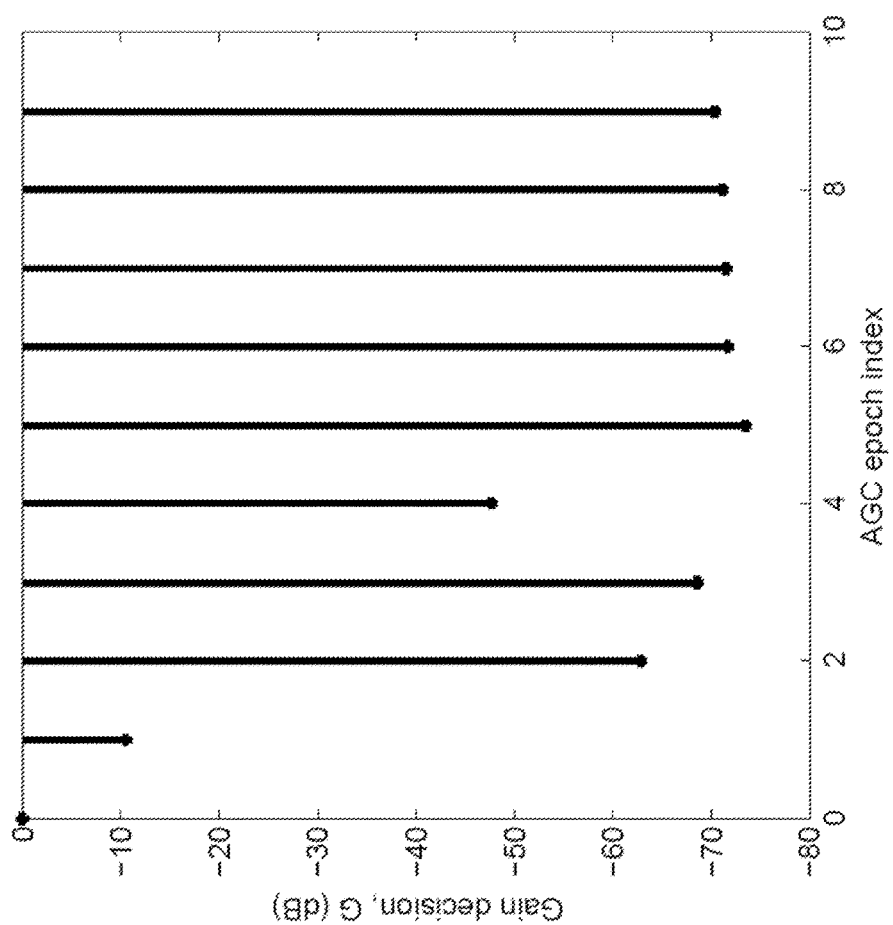
FIG. 5 shows the evolution of the AGC gain decisions for an exemplary embodiment of the disclosed technology.

FIGS. 4A-4D show a sample evolution of the posterior probability distribution $\pi_2(U)$ for AGC epochs n=1, 2, 4 and 8, when the analog power level is set significantly higher than the ADC full-scale, at U=40 dBFS. For this same scenario, FIG. 5 shows the evolution of the gain decisions $\{G_n\}$ as a function of the AGC epoch, n.

In a continuation of this example, it is now assumed that two different waveforms may be supported. Two hypotheses are considered; one for the original OFDM waveform and the other for a constant-envelope waveform. Hypothesis-0 considers X(t) to have Gaussian statistics, whereas hypothesis-1 assumes X(t) uses a phase-modulation only.

Figure 6:
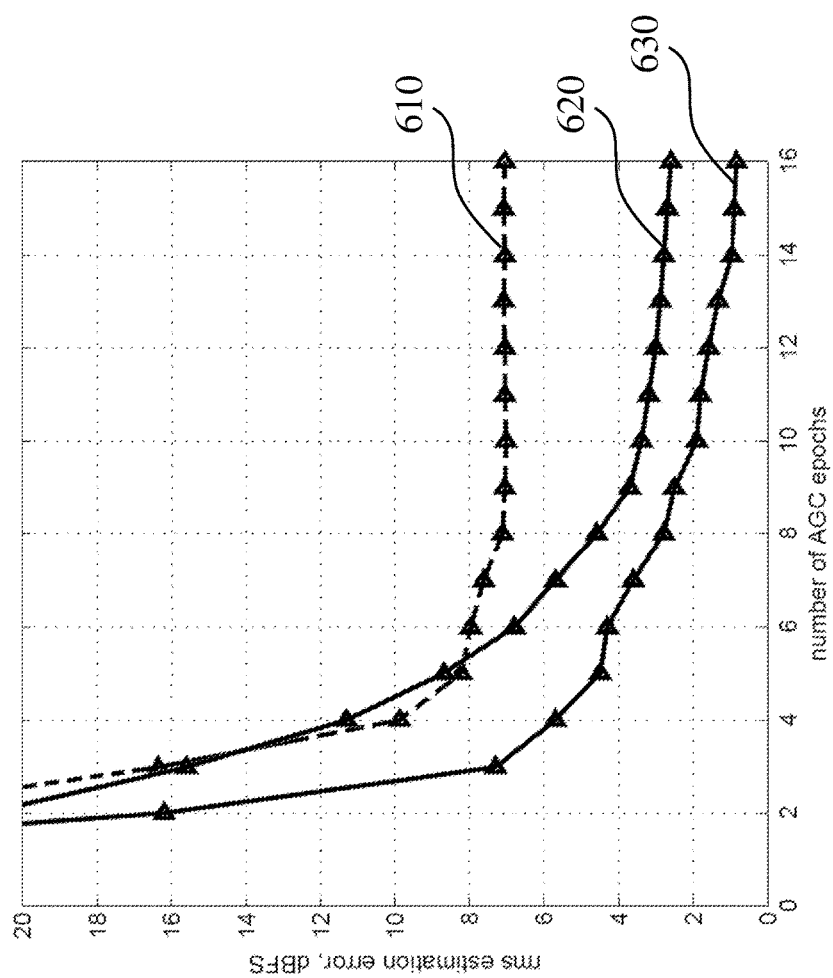
FIG. 6 shows the mean-squared estimation error vs. the number of observations for an exemplary embodiment of the disclosed technology.

Under hypothesis-1, FIG. 6 shows the estimation error, $\mathbb{E}(V^*-V_n)^2$, as a function of the AGC epoch n, over ten thousand analog signal realizations. Under the correct model, the estimation error is driven to zero with increasing n (shown as 630 in FIG. 6), but exhibits a floor under the incorrect hypothesis (hypothesis-0, and as shown as 610 in FIG. 6). When both hypotheses are modeled, the performance (shown as 620 in FIG. 6) is within 2 dB of the correct model after a few AGC epochs.

Figure 7:
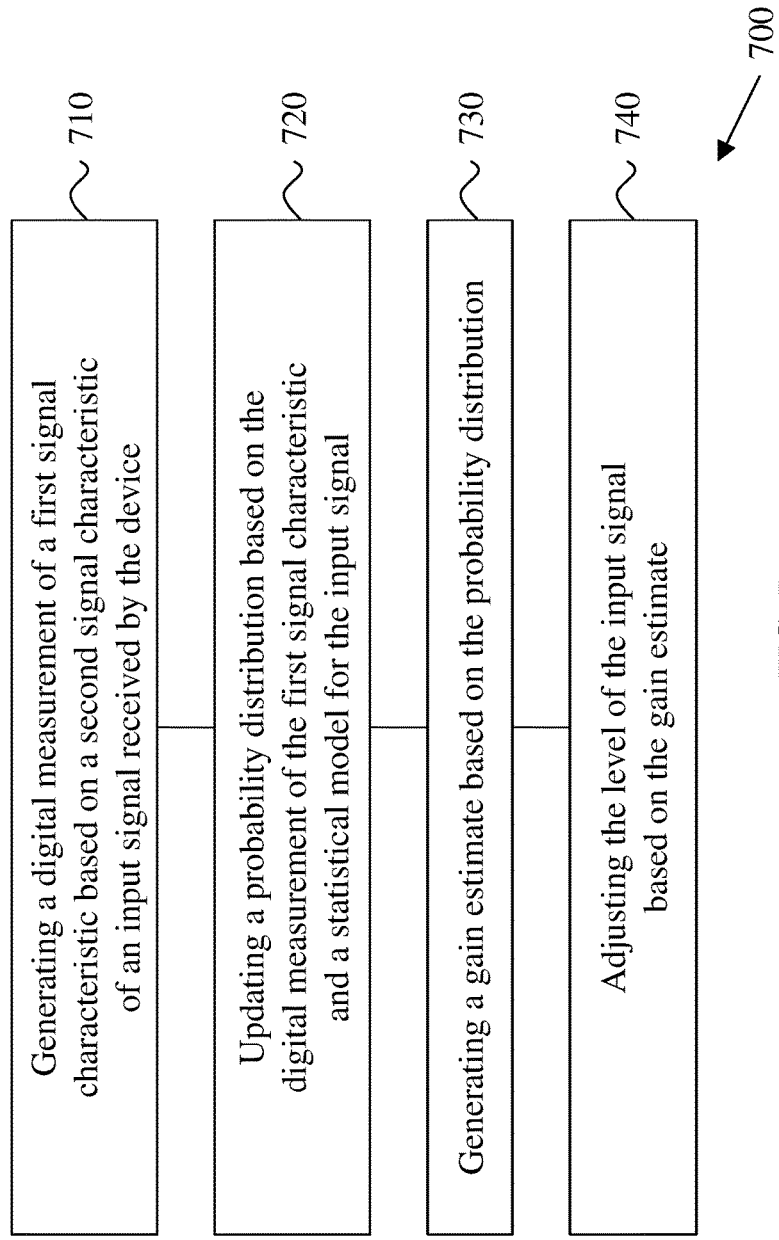
FIG. 7 shows a flowchart of an example of a method for an analog AGC based on estimated distributions of signal characteristics.

FIG. 7 shows a flowchart of an example of a method for analog automatic gain control based on estimated distributions of signal characteristics. The method 700 includes, at step 710, generating a digital measurement of a first signal characteristic based on a second signal characteristic of an input signal received by the device. In some embodiments, an analog-to-digital converter (ADC) may be used to generate the digital measurement (or digital sample) of the first signal characteristic from the second characteristic of the input signal. In some embodiments, the second signal characteristic is based on a level of the input signal.

The method 700 includes, at step 720, updating a probability distribution based on the digital measurement of the first signal characteristic and a statistical model for the input signal. In some embodiments, the probability distribution is based on an estimate of a posterior probability distribution of the second signal characteristic conditioned on a plurality of previous digital measurements of the first signal characteristic.

In some embodiments, the level of an input signal is unknown, e.g. no a priori information is available about the input signal. In this case, the probability distribution is initially set to a uniform probability distribution. In other embodiments, a priori information about the input signal and/or the characteristic of the input signal is available, and the probability distribution is initially set based on this a priori information.

In some embodiments, the statistical model may be based on the waveform being used by the communication system. In other embodiments, the communication system may support more than one waveform, and multiple statistical models may be used, each for one of the supported waveforms. In an example, the statistical model may be a Gaussian distribution.

The method 700 includes, at step 730, generating a gain estimate based on the probability distribution. In some embodiments, the gain estimate is generated based on a mean value of the posterior probability distribution. In other embodiments, the maximum value of the probability distribution is used to generate the gain estimate. In yet other embodiments, other statistical parameters may be used to generate the gain estimate. For example, the median, a function of the variance or standard deviation, or a parameter specific to the statistical model that is assumed for embodiment of the disclosed technology.

The method 700 includes, at step 740, adjusting the level of the input signal based on the gain estimate. In some embodiments, the level is adjusted using a variable gain amplifier (VGA) that may support 50 dB of gain adjustments with a gain resolution of 0.25 dB. In other embodiments, a voltage-controlled amplifier (VCA) may be used to adjust the level.

The method 700 may optionally include filtering to ensure that the digital measurements of the first signal characteristic are (conditionally) independent given statistics of the second signal characteristic.

Figure 8:
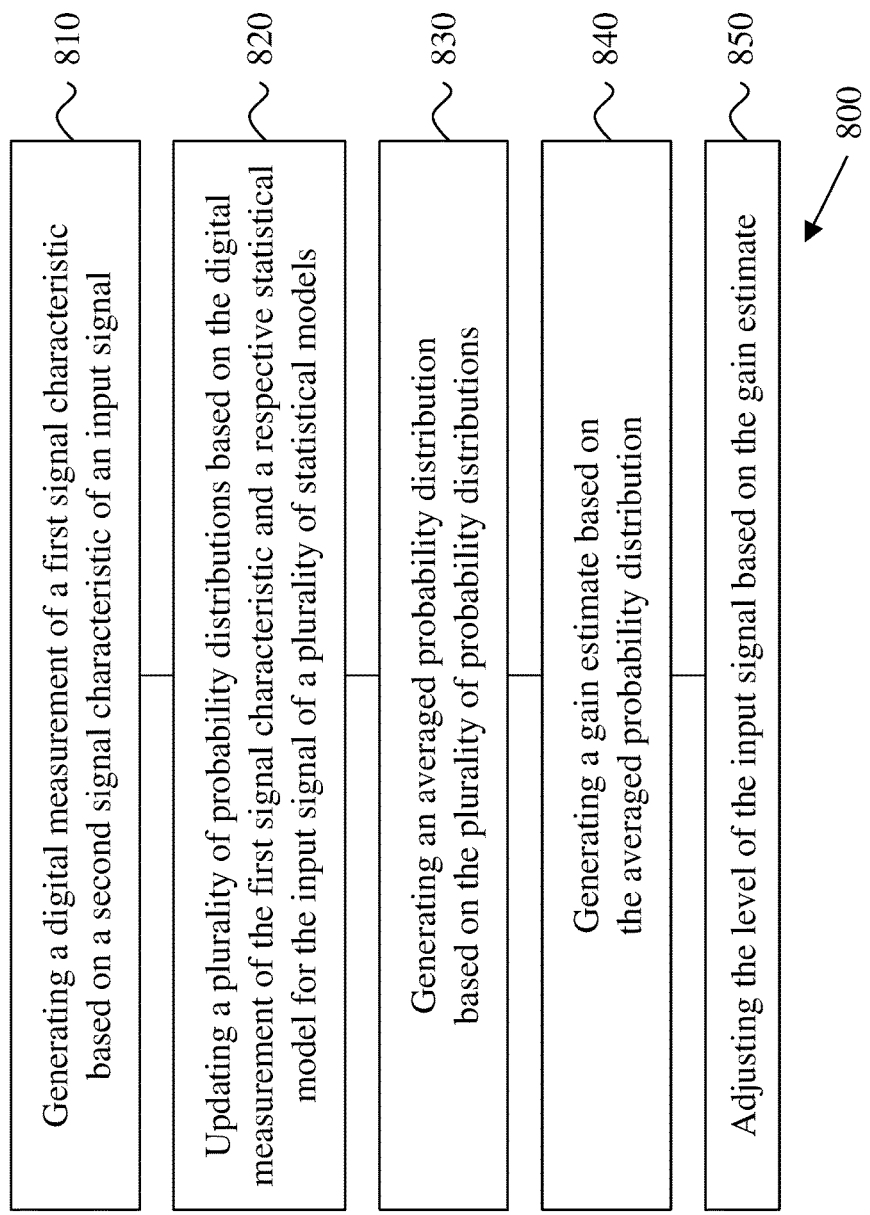
FIG. 8 shows a flowchart of another example of a method for an analog AGC based on estimated distributions of signal characteristics.

FIG. 8 shows a flowchart of another example of a method for analog automatic gain control based on estimated distributions of signal characteristics. This example includes some steps and/or features that are similar to those shown in FIG. 7, and described above. At least some of these steps and/or features may not be separately described in this section.

The method 800 includes, at step 810, generating a digital measurement of a first signal characteristic based on a second signal characteristic of an input signal received by the device. In some embodiments, the second signal characteristic is based on a level of the input signal; e.g., the power, RMS value, or L1-norm, and the like.

The method 800 includes, at step 820, updating each of a plurality of probability distributions based on the digital measurement of the first signal characteristic and a respective statistical model for the input signal of a plurality of statistical models. In some embodiments, a communication system comprising embodiments of the disclosed technology may support more than one waveform. In these scenarios, a mismatched statistical model may lead to degraded performance, and thus, some embodiments may use multiple statistical models for each supported waveform. Each of these statistical models may be used to update the respective posterior probability distribution, as well as the probability of the waveform, as described in this document.

The method 800 includes, at step 830, generating an averaged probability distribution based on the plurality of probability distributions. In some embodiments, the averaged probability distribution is based on a weighted average of each of the probability distributions. The weights of the weighted average may be based on a likelihood of using a respective each of the waveforms supported by the communication system.

The method 800 includes, at step 840, generating a gain estimate based on the averaged probability distribution. In some embodiments, generating the gain estimate includes using a mean value based decision rule. In other embodiments, a maximum value based decision rule is used to generate the gain estimate. And the method 800 further includes, at step 850, adjusting the analog power level of the input signal based on the gain estimate.

Figure 9:
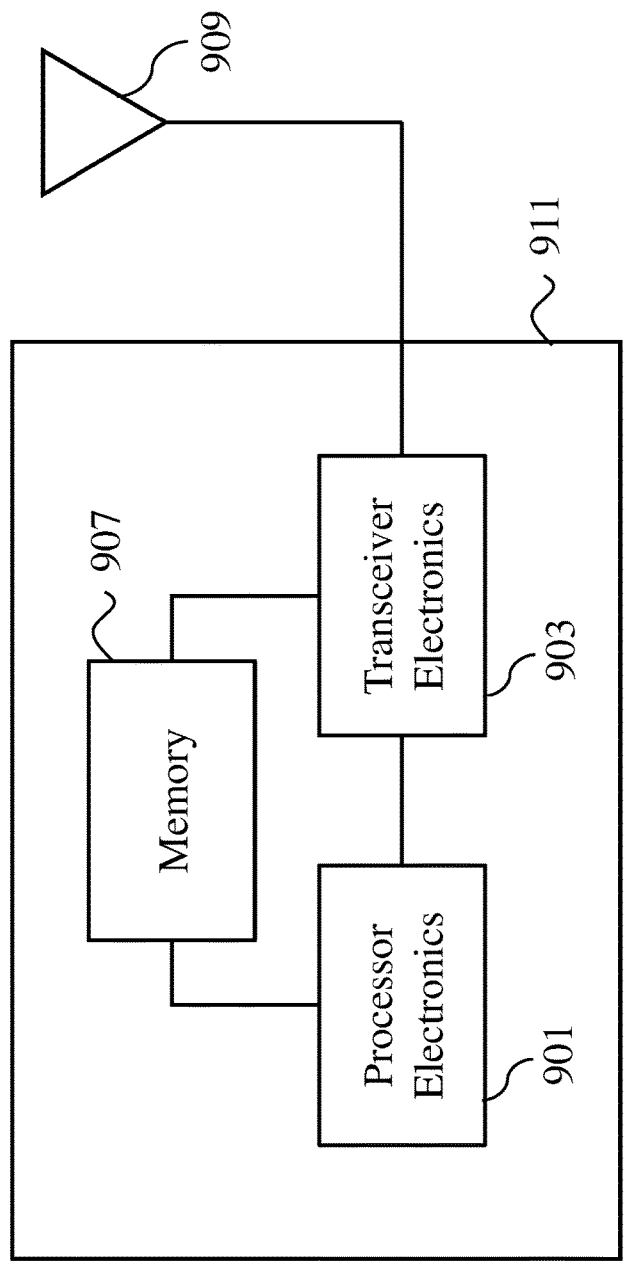
FIG. 9 is a block diagram representation of a portion of a radio that may be used to implement embodiments of the disclosed technology.

FIG. 9 is a block diagram representation of a portion of a radio, in accordance with some embodiments of the presently disclosed technology. A radio 911 can include processor electronics 901 such as a microprocessor that implements one or more of the techniques presented in this document. The radio 911 can include transceiver electronics 903 to send and/or receive wireless signals over one or more communication interfaces such as antenna(s) 909. The radio 911 can include other communication interfaces for transmitting and receiving data. Radio 911 can include one or more memories 907 configured to store information such as data and/or instructions. In some implementations, the processor electronics 901 can include at least a portion of the transceiver electronics 903. In some embodiments, at least some of the disclosed techniques, modules or functions (including methods 700 and 800) are implemented using the radio 911.

It is intended that the specification, together with the drawings, be considered exemplary only, where exemplary means an example and, unless otherwise stated, does not imply an ideal or a preferred embodiment. As used herein, "or" is intended to include "and/or", unless the context clearly indicates otherwise.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this disclosure.

What is claimed is:

1. A method for automatic gain control in a device, comprising:
    generating a digital measurement of a first signal characteristic based on a second signal characteristic of an input signal received by the device, wherein the second signal characteristic is based on a level of the input signal;
    updating a probability distribution based on the digital measurement of the first signal characteristic and a statistical model for the input signal, wherein the probability distribution is based on an estimate of a posterior probability distribution of the second signal characteristic conditioned on a plurality of previous digital measurements of the first signal characteristic;
    generating a gain estimate based on the probability distribution; and
    adjusting the level of the input signal based on the gain estimate.

2. The method of claim 1, wherein the probability distribution is initially set to a uniform probability distribution.

3. The method of claim 1, wherein the probability distribution is initially set based on a priori knowledge of the second signal characteristic of the input signal.

4. The method of claim 1, wherein the generating the gain estimate comprises determining a mean value of the probability distribution.

5. The method of claim 1, wherein the generating the gain estimate comprises determining a maximum value of the probability distribution.

6. The method of claim 1, wherein the statistical model is based on a waveform supported by the device.

7. The method of claim 1, wherein the first signal characteristic is one of a power, a root mean square value, or an L1-norm, and wherein the second signal characteristic is one of a power, a root mean square value, or an L1-norm.

8. An apparatus for automatic gain control, the apparatus comprising:
    an analog-to-digital converter (ADC) configured to generate a digital measurement of a first signal characteristic based on a second signal characteristic of an input signal received by the ADC, wherein the second signal characteristic is based on a level of the input signal;
    a processor coupled to the ADC, wherein the processor is configured to:
        receive information on the digital measurement of the first signal characteristic from the ADC,
        update a probability distribution based on the digital measurement of the first signal characteristic and a statistical model for the input signal, wherein the probability distribution is based on an estimate of a posterior probability distribution of the second signal characteristic conditioned on a plurality of previous digital measurements of the first signal characteristic, and
        generate a gain estimate based on the probability distribution; and
    a variable gain amplifier (VGA) coupled to the ADC and the processor, and configured to:
        receive information of the gain estimate from the processor, and
        adjust the level of the input signal based on the gain estimate.

9. The apparatus of claim 8, further comprising:
    a front-end; and
    a digital receiver, wherein the level of the input signal ranges from a minimum value to a maximum value, and wherein the minimum and maximum values are based on at least one of a sensitivity of the digital receiver and a maximum power that can be handled by the front-end.

10. The apparatus of claim 8, wherein the processor is configured to generate the gain estimate by determining a mean value of the probability distribution.

11. The apparatus of claim 8, wherein the processor is configured to generate the gain estimate by determining a maximum value of the probability distribution.

12. The apparatus of claim 8, wherein the variable gain amplifier supports up to 50 dB of gain adjustments with a gain resolution of 0.25 dB.

13. The apparatus of claim 8, wherein the probability distribution is initially set to a uniform probability distribution.

14. The apparatus of claim 8, wherein the probability distribution is initially set based on a priori knowledge of the second signal characteristic of the input signal.

15. The apparatus of claim 8, wherein the first signal characteristic is one of a power, a root mean square value, or an L1-norm, and wherein the second signal characteristic is one of a power, a root mean square value, or an L1-norm.

16. A method for automatic gain control in a device, comprising:
generating a digital measurement of a first signal characteristic based on a second signal characteristic of an input signal received by the device, wherein the second signal characteristic is based on a level of the input signal;
updating a plurality of probability distributions, wherein each of the plurality of probability distributions is updated based on the digital measurement of the first signal characteristic and a respective statistical model for the input signal of a plurality of statistical models, and wherein each of the plurality of probability distributions is an estimate of a posterior probability distribution of the second signal characteristic conditioned on a plurality of previous digital measurements of the first signal characteristic;
generating an averaged probability distribution based on the plurality of probability distributions;
generating a gain estimate based on the averaged probability distribution; and
adjusting the level of the input signal based on the gain estimate.

17. The method of claim 16, wherein each of the plurality of statistical models corresponds to each of a plurality of waveforms supported by the device.

18. The method of claim 17, wherein the averaged probability distribution is based on a weighted average of each of the plurality of probability distributions, and wherein weights of the weighted average are based on a likelihood of using a respective each of the plurality of waveforms.

19. The method of claim 16, wherein the generating the gain estimate comprises using a mean value based decision rule.

20. The method of claim 16, wherein the generating the gain estimate comprises using a maximum value based decision rule.

* * * * *